United States Patent
Yen et al.

(10) Patent No.: US 9,086,456 B2
(45) Date of Patent: Jul. 21, 2015

(54) OPTIMIZATION OF A STORAGE SYSTEM CONTAINING ECC AND SCRAMBLE ENGINES

(71) Applicants: Chih-Nan Yen, Hsichu (TW); Chia-Wei Chang, Hsinchu (TW)

(72) Inventors: Chih-Nan Yen, Hsichu (TW); Chia-Wei Chang, Hsinchu (TW)

(73) Assignee: Storart Technology Co. Ltd, Hsinchu (TW)

( * ) Notice: Subject to any disclaimer, the term of this patent is extended or adjusted under 35 U.S.C. 154(b) by 145 days.

(21) Appl. No.: 13/934,239

(22) Filed: Jul. 3, 2013

(65) Prior Publication Data

US 2015/0012788 A1 Jan. 8, 2015

(51) Int. Cl.
*G01R 31/3185* (2006.01)
*G11C 29/00* (2006.01)
*G11C 29/04* (2006.01)

(52) U.S. Cl.
CPC ........ *G01R 31/318536* (2013.01); *G11C 29/00* (2013.01); *G11C 2029/0411* (2013.01)

(58) Field of Classification Search
CPC .............................................. G01R 31/318536
See application file for complete search history.

(56) References Cited

U.S. PATENT DOCUMENTS

| | | | |
|---|---|---|---|
| 2012/0297271 A1* | 11/2012 | Sommer et al. | 714/766 |
| 2013/0101111 A1* | 4/2013 | Sharon et al. | 380/28 |
| 2013/0219247 A1* | 8/2013 | Yang | 714/766 |
| 2014/0310534 A1* | 10/2014 | Gurgi et al. | 713/193 |

* cited by examiner

*Primary Examiner* — Sam Rizk
(74) *Attorney, Agent, or Firm* — Che-Yang Chen; Law office of Michael Chen

(57) ABSTRACT

A method for selecting the scrambling and descrambling data transmitted in a storage system containing ECC and scramble engines with a seed table is disclosed and the steps comprises: encoding a data sent from a HOST interface by an ECC encoding engine and transmitting the data to a LFSR scramble engine; scrambling the data by the LFSR scramble engine and transmitting to a storage device; creating a seed value and transmitting the seed value to a seed table by the LFSR scramble engine; receiving the seed value from the seed table and the scrambled data from the storage device by a LFSR descramble engine, and descrambling the scrambled data based on the seed value and transmitting to an ECC decoding engine; and decoding the descrambled data received from the LFSR descramble engine and then acquiring the original data sent from the HOST interface.

2 Claims, 4 Drawing Sheets

OPTIMIZATION OF A STORAGE SYSTEM CONTAINING ECC AND SCRAMBLE ENGINES

FIELD OF THE INVENTION

The present invention relates to a method for optimizing a storage system, and more particularly to an optimization method for selecting the scrambling and descrambling data transmitted in a storage system containing ECC and scramble engines with a seed table.

BACKGROUND OF THE INVENTION

Generally, a path for transferring or receiving information could be referred to as a channel. Information may be transmitted within the channel through wired or wireless communication way. Furthermore, a channel may be referred to as storing information in a semiconductor memory device and reading the stored information from the semiconductor memory device. The channel may be a physical path for storing information in the semiconductor memory device and reading the stored information form the semiconductor memory device.

When information is transmitted through the channel, the transmitted information may be corrupted and may include a number of errors. If the number of errors in transmitted information exceeds predetermined number of errors, a decoder may not be able to restore the initial transmission.

Please reference to U.S. Pat. No. 8,171,382 B2. Depending on the channel (memory channel) response to transmitted information, the error rate in the channel may be relative large, especially the channel is a multi-bit memory device. In order to eliminate error induced from channel, an easy way is to prevent data stream transmitted on channel has long sequence of logical '0' or '1'. A scrambler is designed to prevent such long sequence of logical '0' or '1', and a descrambler is to reconstruct original signal sequence. Conventionally the scrambler is implemented as a binary linear feedback shift register (LFSR), and the descrambler is implemented as a binary linear feed forward shift register.

Please refer to FIG. 1, which shows a conventional storage device system. A storage device 14 is electrically connected with a HOST interface 11, a RAM 12, an ECC engine 13, a scramble engine 15, and a processor 16. For case of data saving to storage device 14, data may come from the HOST interface 11. The processor 16 may calculate a physical address to be saved to the storage device 14, and pass data stream to the ECC engine 13 for encoding. The ECC engine 13 for encoding may be used X1 bits to protect X2 bits of information data. That is, the X1 is larger, and the performance of protection is better. That is, every X2 bits data transfers on the bus, the ECC engine 13 for encoding may generate a set of X1 bits error correction code appended at the end of information data. The engine 15 may include a scrambler 151 and a descrambler 152. The scrambler 151 may be a LFSR (linear feedback shift register) scrambler to take these data and output a scrambled data sequence to the storage device 14. For case of data reading from the storage device 14, the processor 16 may calculate the physical address of a desired data, and read it out to the descrambler 152. Then, the descrambler 152 may be a LFSR descrambler to receive the data from the storage device 14, and output the descrambled data. The ECC decoding engine 13 may check the error correction code every X2 bits, and try to recover the errors. The recovered data may be sent to the HOST interface 11.

Currently, research efforts are continuing in the area of detecting error from corrupted information, and eliminating the corrupted information from the initial transmission. Encoding error control codes may be referred to as a process of adding error control codes to initial information prior to transmitting. Decoding error control codes may be referred to as a process of separating error control code from received transmission information to restore the initial information.

SUMMARY OF THE INVENTION

It is an objective of the present invention to provide a method for selecting the scrambling and descrambling data transmitted in a storage system containing ECC and scramble engines with a seed table, which is capable of giving an economic solution for improving the size of the seed table size and the performance of the LFSR scramble engine.

A method for selecting the scrambling and descrambling data transmitted in a storage system containing ECC and scramble engines with a seed table is provided and the steps comprising:

step S1: encoding a data sent from a HOST interface by an ECC encoding engine and transmitting the data to a LFSR scramble engine;

step S2: scrambling the data by the LFSR scramble engine and transmitting to a storage device;

step S3: creating a seed value and transmitting the seed value to a seed table by the LFSR scramble engine;

step S4: receiving the seed value from the seed table and the scrambled data from the storage device by a LFSR descramble engine, and descrambling the scrambled data based on the seed value and transmitting to an ECC decoding engine; and step S5: decoding the descrambled data received from the LFSR descramble engine and then acquiring the original data sent from the HOST interface.

In some embodiments, the ECC decoding engine may decode the data every X2 bytes, saving the seed value of every beginning of X2 bytes or times of X2 bytes may get the best performance, and the seed value may be repeated every X3 bytes and then the size of the seed table may be reduced.

The ECC decoding engine decodes the data every 1,024 bytes, then the seed table only saves the seed value of every 1K bytes, or times of 1K bytes; and the density of the storage device is 8G bytes, then the seed table is reduced to 8M entries or less depending on performance requirement.

DESCRIPTION OF THE PREFERRED EMBODIMENT

Figure 1:
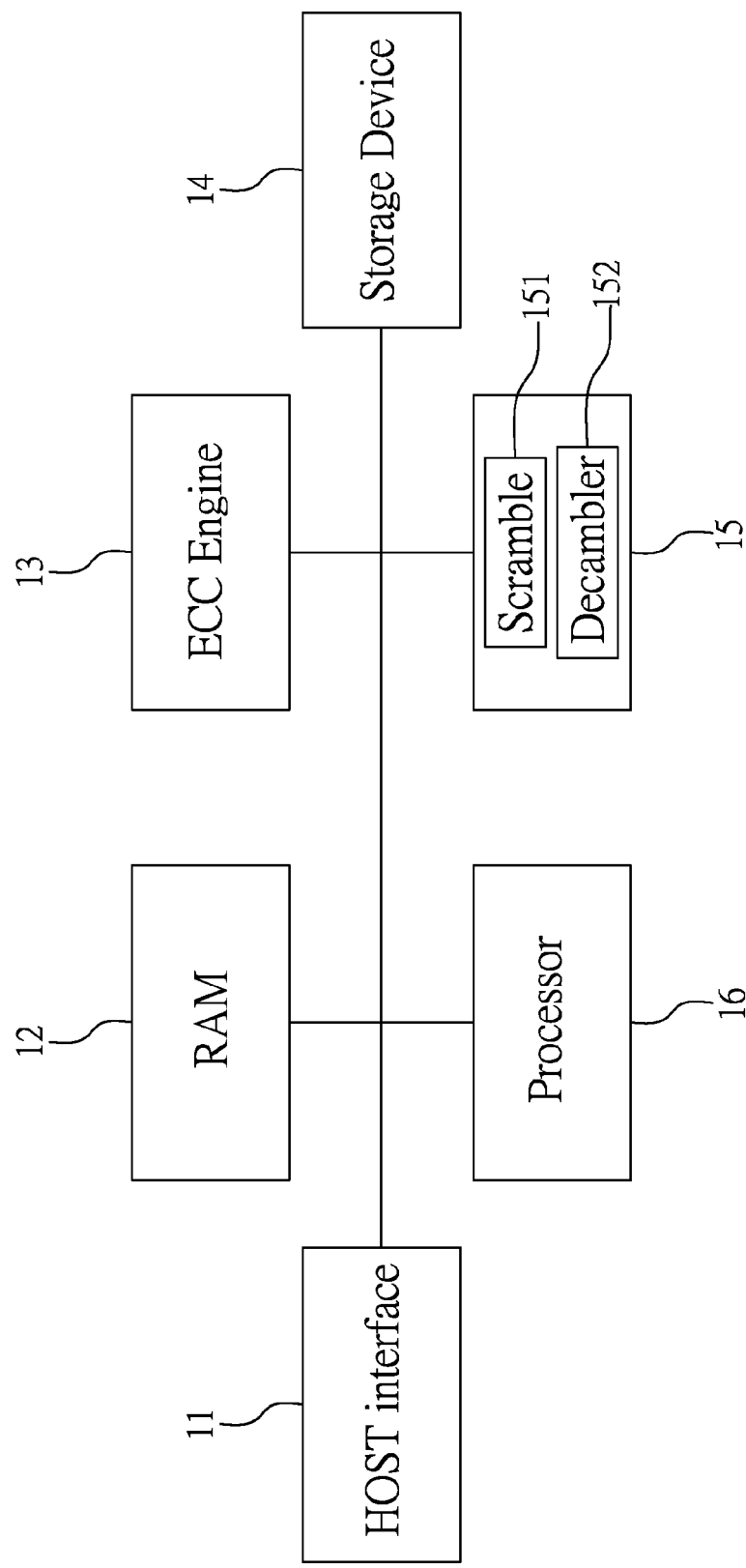
FIG. 1 shows a schematic block diagram of a conventional storage device system.
Figure 2:
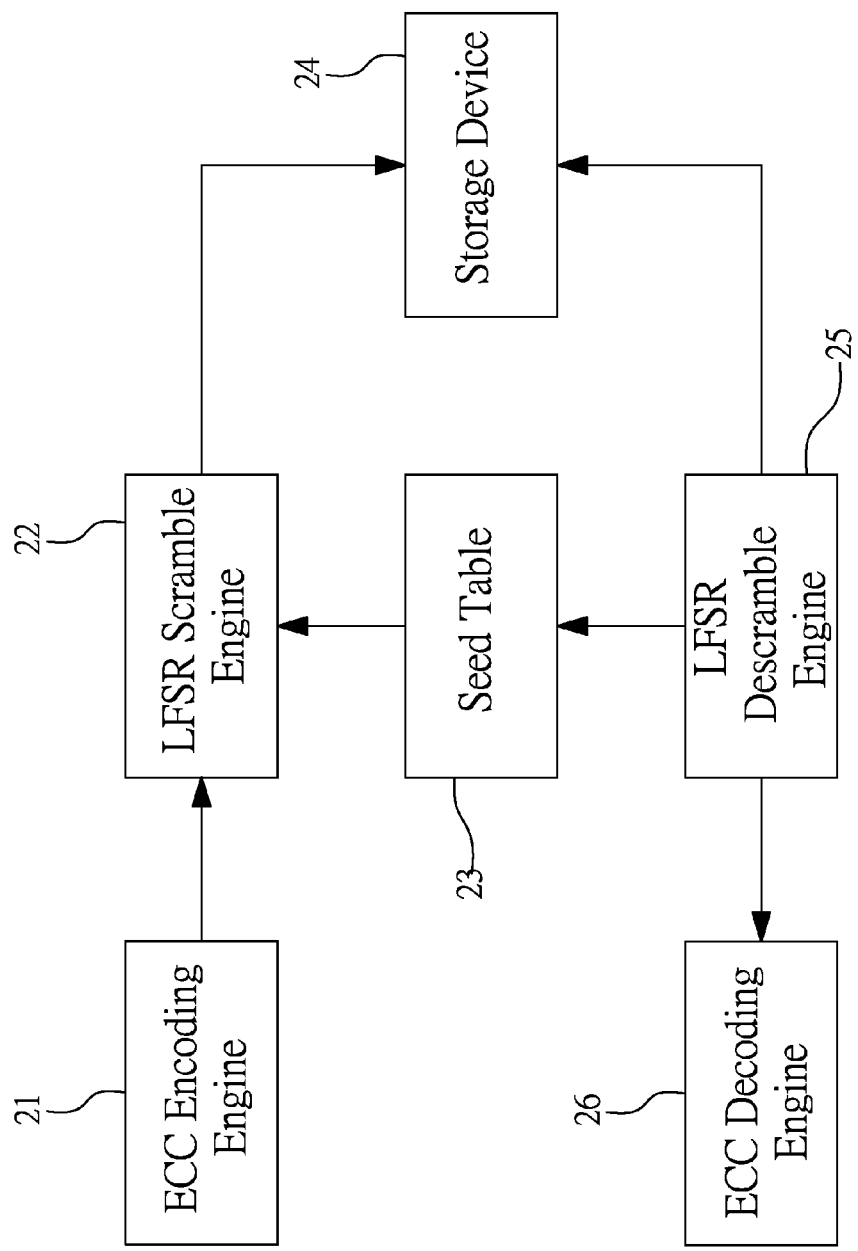
FIG. 2 shows a schematic block diagram of the details of a decoding system in accordance with this invention.

FIG. 2 shows a schematic block diagram of the details of a decoding system in accordance with this invention. The system for selecting the scrambling and descrambling data transmitted in a storage system containing ECC and scramble engines with a seed table of this invention comprises an ECC encoding engine 21, a LFSR scramble engine 22, a seed table 23, a LFSR descramble engine 25, and an ECC decoding engine 26, which may replace the ECC engine 15 and the scramble engine 15 in FIG. 1. The ECC encoding engine 21 may be electrically connected with the HOST interface 11 (shown in FIG. 1) and the LSFR scramble engine 22. The LSFR scramble engine 22 may be further electrically connecting with the seed table 23 and the storage device 24. The LFSR descramble engine 25 may be electrically connected with the seed table 23, the storage device 24, and the ECC decoding engine 26.

As known in the conventional storage device system in FIG. 1, the LFSR scramble engine 22 needs a seed value to start a scramble process. Furthermore, the scrambled data needs the same seed value to descramble the data. The limitation of original design is no matter what data HOST wants to get, and the scrambled data always needs to be descrambled from the first bytes.

A huge seed table 23 is needed to save all seed value, but this is not an economic way. This invention gives an economic solution for improving seed table size and LFSR scramble engine performance.

Figure 4:
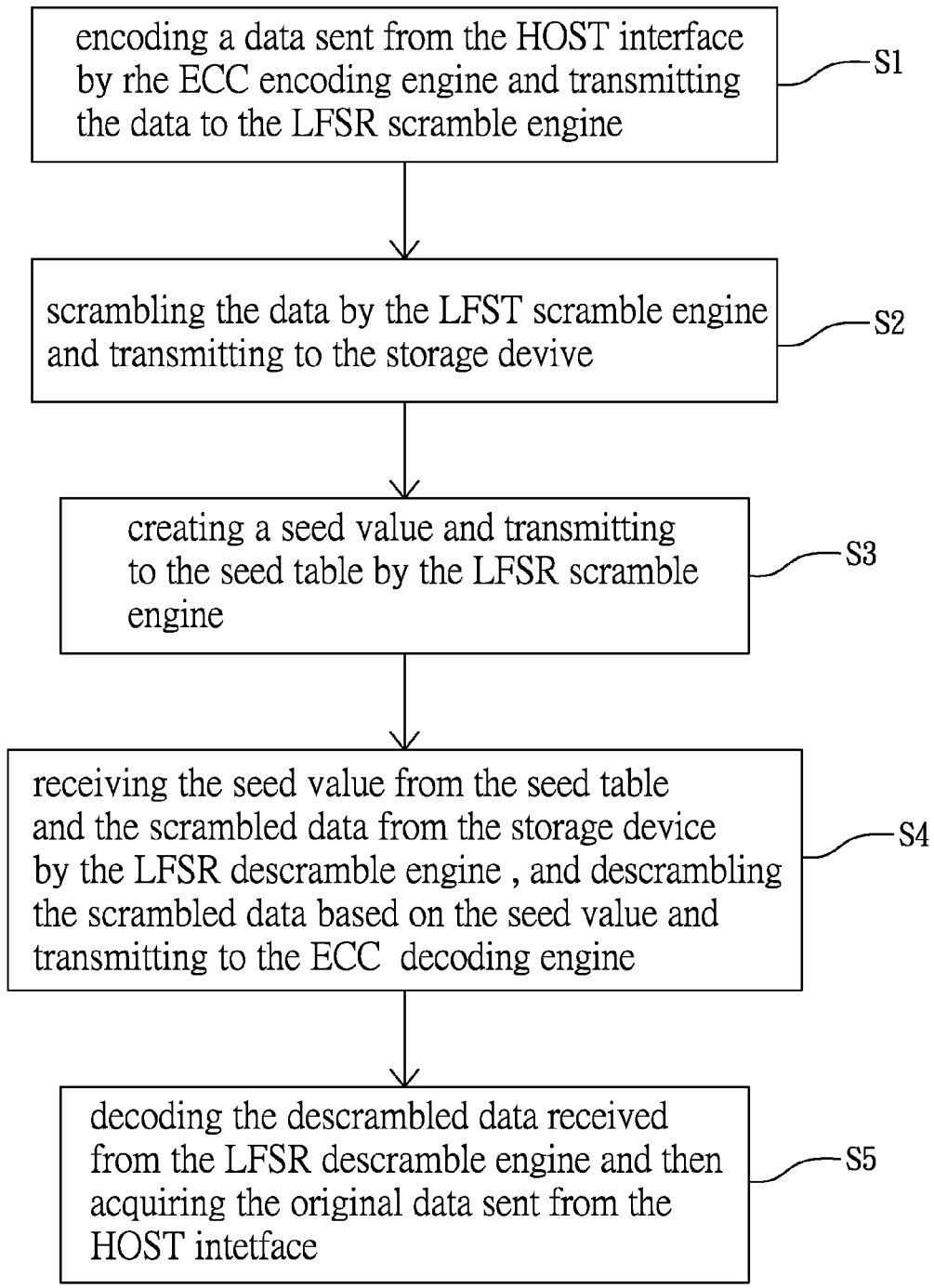
FIG. 4 shows a flow chart of the method for selecting the scrambling and descrambling data transmitted in a storage system containing ECC and scramble engines with a seed table in accordance with this invention.

Please refer to FIG. 4, which shows a flow chart of the method for selecting the scrambling and descrambling data transmitted in a storage system containing ECC and scramble engines with a seed table in accordance with this invention. The method for selecting the scrambling and descrambling data transmitted in a storage system containing ECC and scramble engines with a seed table of this invention comprises the steps as below:

step S1: encoding a data sent from the HOST interface 11 by the ECC encoding engine 21 and transmitting the data to the LFSR scramble engine 22;

step S2: scrambling the data by the LFSR scramble engine 22 and transmitting to the storage device 24;

step S3: creating a seed value and transmitting the seed value to the seed table 23 by the LFSR scramble engine 22;

step S4: receiving the seed value from the seed table 23 and the scrambled data from the storage device 24 by the LFSR descramble engine 25, and descrambling the scrambled data based on the seed value and transmitting to the ECC decoding engine 26; and step S5: decoding the descrambled data received from the LFSR descramble engine 25 and then acquiring the original data sent from the HOST interface 11.

The ECC decoding engine 26 may decode data every X2 bytes. The value X2 is the basic unit for ECC decoding, even if the HOST just wants to read only 1-byte data. As this reason, saving the seed value of every beginning of X2 bytes or times of X2 bytes may get the best performance. For example, if the ECC decoding engine 26 decodes data every 1,024 bytes, then the seed table 23 only saves the seed value of every 1K bytes, or times of 1K bytes. If the density of the storage device is 8G bytes, then the seed table 23 may be reduced to 8M entries or less depending on performance requirement. Furthermore, the seed value may be repeated every X3 bytes, then the size of the seed table 23 may be reduced. Based on previous example, if the seed value repeats every 2M bytes, then the size of the seed table 23 may be reduced to 2K entries or less.

Figure 3:
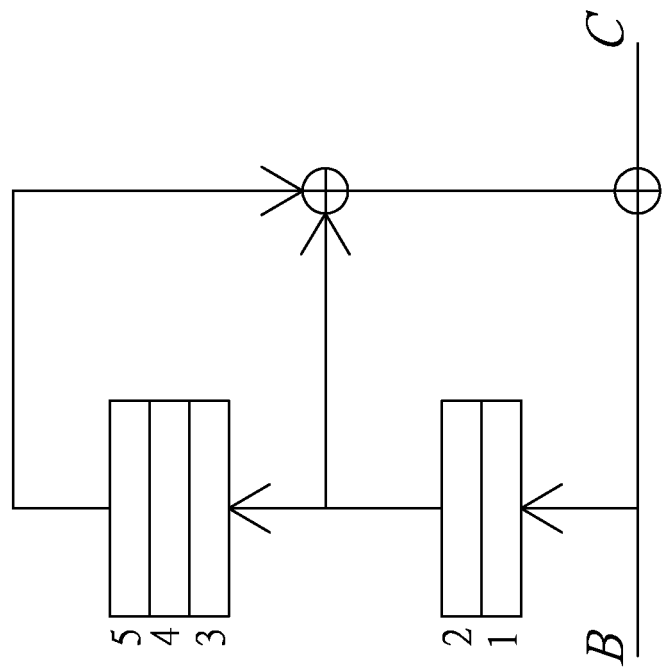
FIG. 3 shows an example of hardware implementation with Scrambler and Descrambler engines.
Figure 3:
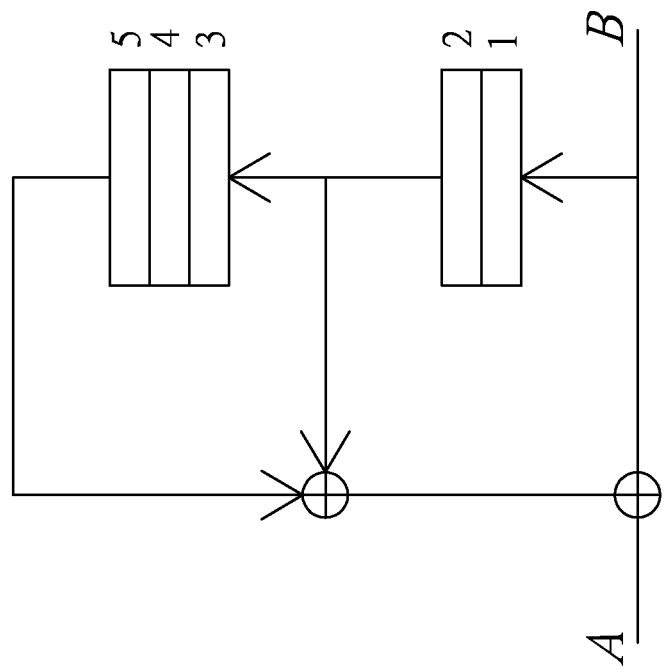

Example of hardware implementation is as FIG. 3. Assume original data is $A_m$, and the data after scrambling may be equated as $$B_m = A_m \oplus B_{m-2} \oplus B_{m-5}.$$

The reconstructed data can be equated as followed.

$$C_m = B_m \oplus B_{m-2} \oplus B_{m-5} = (A_m \oplus B_{m-2} \oplus B_{m-5}) \oplus B_{m-2} \oplus B_{m-5} = A_m.$$

Bit-wise level LFSR structures are well-known in the art. Scrambler or called Randomizer performs a logical operation on the information to be transmitted using a polynomial with binary coefficients implemented via the LFSR. Data may be carried out using the inverse operation of the same polynomial.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for selecting the scrambling and descrambling data transmitted in a storage system containing ECC and scramble engines with a seed table, comprising:
    encoding a data sent from a HOST interface by an ECC encoding engine and transmitting the data to a LFSR scramble engine;
    scrambling the data by the LFSR scramble engine and transmitting to a storage device;
    creating a seed value and transmitting the seed value to a seed table by the LFSR scramble engine;
    receiving the seed value from the seed table and the scrambled data from the storage device by a LFSR descramble engine, and descrambling the scrambled data based on the seed value and transmitting to an ECC decoding engine; and
    decoding the descrambled data received from the LFSR descramble engine and then acquiring the original data sent from the HOST interface,
        wherein the ECC decoding engine decodes the data every X2 bytes, saving the seed value of every beginning of X2 bytes or times of X2 bytes get the best performance, and the seed value is repeated every X3 bytes and then the size of the seed table is reduced.

2. The method according to claim 1, wherein the ECC decoding engine decodes the data every 1,024 bytes, then the seed table only saves the seed value of every 1K bytes, or times of 1K bytes; and the density of the storage device is 8G bytes, then the seed table is reduced to 8 millions of entries or less depending on performance requirement.

* * * * *